US006376381B1

United States Patent
Sabde

(10) Patent No.: US 6,376,381 B1
(45) Date of Patent: Apr. 23, 2002

(54) PLANARIZING SOLUTIONS, PLANARIZING MACHINES, AND METHODS FOR MECHANICAL AND/OR CHEMICAL-MECHANICAL PLANARIZATION OF MICROELECTRONIC SUBSTRATE ASSEMBLIES

(75) Inventor: Gundu M. Sabde, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/387,306

(22) Filed: Aug. 31, 1999

(51) Int. Cl.$^7$ .................. H01L 21/302; H01L 21/461
(52) U.S. Cl. .................. 438/693; 438/634; 438/437
(58) Field of Search .................. 438/690–693, 438/626, 631, 633, 634, 645, 435, 437

(56) References Cited

U.S. PATENT DOCUMENTS

| 3,940,248 | A | * | 2/1976 | Yamaguchi et al. ....... 21/2.7 R |
| 5,769,689 | A | * | 6/1998 | Cossaboon et al. ........... 451/41 |
| 5,770,095 | A | * | 6/1998 | Sasaki et al. .................. 216/38 |
| 5,958,794 | A | * | 9/1999 | Bruxvoort et al. ........... 438/692 |
| 6,066,028 | A | * | 5/2000 | Cheng et al. .................. 451/28 |
| 6,117,775 | A | * | 9/2000 | Kondo et al. ............... 438/690 |
| 6,191,037 | B1 | * | 2/2001 | Robinson et al. ........... 438/690 |

FOREIGN PATENT DOCUMENTS

US WO 98/18159 * 4/1998

OTHER PUBLICATIONS

Hayashi et al. "A New Abrasive–Free, Chemical Mechanical Polishing Technique for Aluminum Metallization of ULSI Devices" IEEE, International Electron Devices Meeting, pp. 976–978, Dec. 1992.*
Hackh's Chemical Dictionary, 4th Ed, Grant, ed., McGraw–Hill: New York, p. 650, 1969.*

* cited by examiner

Primary Examiner—Charles Bowers
Assistant Examiner—Erik Kielin
(74) Attorney, Agent, or Firm—Dorsey & Whitney LLP

(57) ABSTRACT

Microelectronic substrate assemblies are planarized using methods, planarizing solutions and planarizing machines according to various embodiments of the present invention. A substrate is assembly pressed against a planarizing surface of a fixed-abrasive polishing pad, covering an operative portion of the planarizing surface with a non-abrasive planarizing solution, and moving the substrate assembly and/or the polishing pad with respect to the other. The fixed-abrasive polishing pad includes a body having a suspension medium and abrasive particles fixedly attached to the suspension medium at the planarizing surface. The substrate assembly is a stop-on-feature device including a substrate, a polish-stop layer formed over the substrate to conform to a topography of features on the substrate, and a cover layer formed over the polish-stop layer. The planarizing solution includes a mechanical selectivity agent that increases the mechanical removal rate of the cover layer and/or reduces the mechanical removal rate of the polish-stop layer compared to planarizing solutions without the mechanical selectivity agent.

13 Claims, 3 Drawing Sheets

PLANARIZING SOLUTIONS, PLANARIZING MACHINES, AND METHODS FOR MECHANICAL AND/OR CHEMICAL-MECHANICAL PLANARIZATION OF MICROELECTRONIC SUBSTRATE ASSEMBLIES

TECHNICAL FIELD

The present invention relates to methods, planarizing solutions and apparatuses for planarizing microelectronic substrate assemblies in mechanical and/or chemical-mechanical planarization.

BACKGROUND OF THE INVENTION

Mechanical and chemical-mechanical planarizing processes (collectively "CMP") are used in the manufacturing of electronic devices for forming a flat surface on semiconductor wafers, field emission displays, and many other microelectronic substrate assemblies. CMP processes generally remove material from a substrate assembly to create a highly planar surface at a precise elevation in the layers of material on the substrate assembly.

FIG. 1 schematically illustrates a rotary CMP machine 10 for planarizing a microelectronic substrate assembly 12. The rotary machine 10 has a platen 20, a wafer carrier assembly 30 above the platen 20, and a polishing pad 40 between the platen 20 and the carrier assembly 30. The carrier assembly 30 generally includes a head 32 to pick up, hold and release the substrate assembly 12 at different stages of the planarizing process. The carrier assembly 30 can also include a backing pad 34 to support the back side of the substrate assembly 12. The head 32 may be a weighted, free-floating unit (not shown), or the carrier assembly 30 can further include an actuator 36 attached to the head 32 to impart axial and/or rotational motion (indicated by arrows C and D, respectively).

The polishing pad 40 can be a non-abrasive polymeric pad (e.g., polyurethane), or it may be a fixed-abrasive polishing pad in which abrasive particles are fixedly dispersed in a resin or another type of suspension medium. A planarizing fluid 44 covers the polishing pad 40 during planarization of the substrate assembly 12. The planarizing fluid 44 may be a conventional CMP slurry with abrasive particles that etch and/or oxidize the surface of the substrate assembly 12, or the planarizing fluid 44 may be a "clean" non-abrasive planarizing solution without abrasive particles. Abrasive planarizing solutions can also include surfactants to help suspend the abrasive particles in the solution. For example, Brij 58, ZONYL and other surfactants have been commercially used in only slurries with abrasive particles. In most CMP applications, abrasive slurries with abrasive particles are used on non-abrasive polishing pads, and non-abrasive cleaning solutions without abrasive particles are used on fixed-abrasive polishing pads.

To planarize the substrate assembly 12 with the CMP machine 10, the carrier assembly 30 presses the substrate assembly 12 face-downward against a planarizing surface 42 of the polishing pad 40. At least one of the platen 20 or the head 32 moves relative to the other to move the substrate assembly 12 across the planarizing surface 42 in the presence of the planarizing solution 44. As the face of the substrate assembly 12 moves across the planarizing surface 42, the polishing pad 40 and/or the planarizing solution 44 continually remove material from the face of the substrate assembly 12.

CMP processes should consistently and accurately produce a uniform, planar surface on substrate assemblies to enable circuit and device patterns to be formed with photo-lithography techniques. As the density of integrated circuits increases, it is often necessary to accurately focus the critical dimensions of the photo-patterns to within a tolerance of approximately 0.1 $\mu$m. Focusing photo-patterns to such small tolerances, however, is difficult when the planarized surfaces of substrate assemblies are not uniformly planar. Thus, to be effective, CMP processes should create highly uniform, planar surfaces on substrate assemblies.

In the highly competitive semiconductor industry, it is also desirable to maximize the throughput of CMP processing by producing a planar surface on a substrate assembly as quickly as possible. The throughput of CMP processing is a function of several factors, one of which is the ability to accurately stop CMP processing at a desired endpoint. In a typical CMP process, the desired endpoint is reached when the surface of the substrate assembly is planar and/or when enough material has been removed from the substrate assembly to form discrete components on the substrate assembly (e.g., shallow trench isolation areas, contacts, damascene lines, etc.). Accurately stopping CMP processing at a desired endpoint is important for maintaining a high throughput because the substrate assembly may need to be re-polished if it is "under-planarized," or too much material can be removed from the substrate assembly if it is "over-polished." For example, over-polishing can cause "dishing" in shallow-trench isolation structures or completely destroy a section of the substrate assembly. Thus, it is highly desirable to stop CMP processing at a desired endpoint within the substrate assembly.

One technique to endpoint CMP processing and to form a planar surface on a substrate assembly is to provide stop-on-feature (SOF) wafer structure having a polish-stop layer and a cover layer on the polish-stop layer. The polish-stop layer follows the contour of trenches or components on the wafer such that the polish-stop layer has high areas at the desired endpoint of the CMP process. The cover layer fills depressions in the polish-stop layer and covers the high areas on the polish-stop layer. The cover layer is generally softer than the polish-stop layer so that the polish-stop layer has a much lower polishing rate than the cover layer. For example, the polish-stop layer can be composed of silicon nitride or carbon, and the cover layer can be composed of a metal, silicon dioxide or polysilicon.

During planarization of an SOF wafer, certain high areas of the polish-stop layer are typically exposed before other high areas, such that some of the high areas remain covered by the cover layer. The harder polish-stop layer inhibits mechanical removal of material from the exposed high areas while the abrasive particles still aggressively remove material from the thicker portions of the softer cover layer. The polish-stop layer theoretically endpoints the CMP process when all of the high areas of the polish-stop layer are exposed.

One drawback of CMP processing with an SOF wafer is that the difference in polishing rate between the polish-stop layer and the cover layer may not be adequate to stop planarization at the polish-stop layer. For example, the first areas of the polish-stop layer that are exposed during planarization may be completely removed before the cover layer is removed from the other high areas of the polish-stop layer at the same elevation. This drawback is particularly problematic when using fixed-abrasive polishing pads because the fixed-abrasive particles aggressively remove material from the substrate assembly. Consequently, the difference in hardness between the polish-stop layer and the cover layer may not be adequate to effectively shut down planarization at the high areas of the polish-stop layer in fixed-abrasive CMP applications.

SUMMARY OF THE INVENTION

The present invention is directed toward planarizing solutions, planarizing machines and methods for planarizing semiconductor wafers, field emission displays and other microelectronic substrate assemblies. One method in accordance with the invention includes pressing a substrate assembly against a planarizing surface of a fixed-abrasive polishing pad, covering an operative portion of the planarizing surface with a non-abrasive planarizing solution, and moving the substrate assembly and/or the polishing pad with respect to the other. The fixed-abrasive polishing pad generally includes a body having a suspension medium and abrasive particles fixedly attached to the suspension medium at the planarizing surface. The substrate assembly is a stop-on-feature device including a substrate, a polish-stop layer formed over the substrate to conform to a topography of features on the substrate, and a cover layer formed over the polish-stop layer.

The planarizing solution is a non-abrasive solution without abrasive particles. The planarizing solution generally includes water and a mechanical selectivity agent that increases the mechanical removal rate of the cover layer and/or reduces the mechanical removal rate of the polish-stop layer. The mechanical selectivity agent can accordingly increase the polishing rate of the cover layer and/or reduce the polishing rate of the polish-stop layer to increase the polishing rate ratio between the cover layer and the polish-stop layer. By increasing the polishing rate ratio, it is less likely that exposed high areas of the polish-stop layer will be completely removed from the substrate assembly before the cover layer is removed from other high areas of the polish-stop layer. Accordingly, methods for fixed-abrasive CMP processing in accordance with the invention are expected to enhance the planarity of the finished surfaces and the accuracy of endpointing.

DETAILED DESCRIPTION OF THE INVENTION

The present invention is directed towards methods, planarizing solutions and planarizing machines for mechanical and/or chemical-mechanical planarization of semiconductor wafers, field emission displays and other microelectronic substrate assemblies. Many specific details of certain embodiments of the invention are set forth in the following description and in FIGS. 2 and 3 to provide a thorough understanding of such embodiments. One skilled in the art however, will understand that this invention may have additional embodiments, or that this invention may be practiced without several of the details described in the following description.

Figure 1:
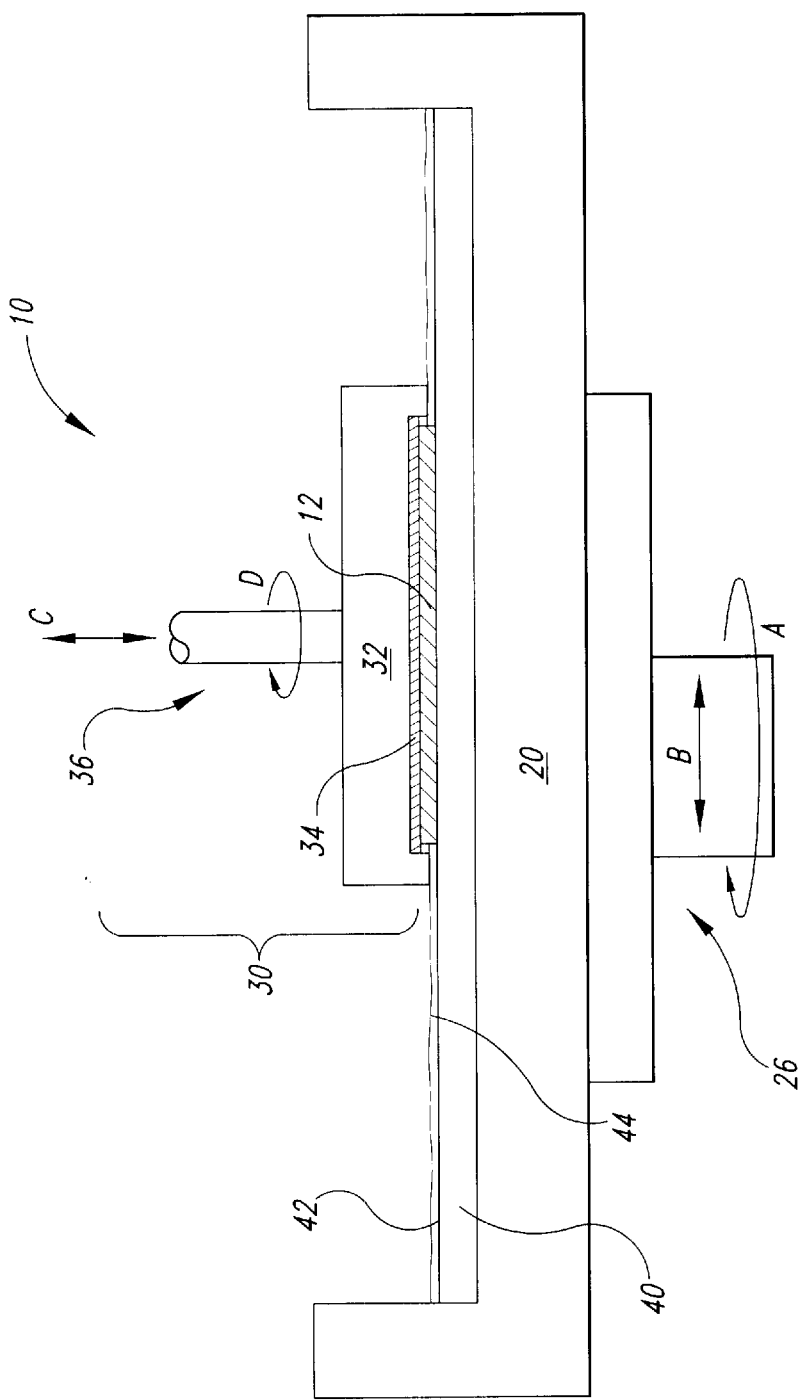
FIG. 1 is a schematic cross-sectional view of a planarizing machine in accordance with the prior art.
Figure 2:
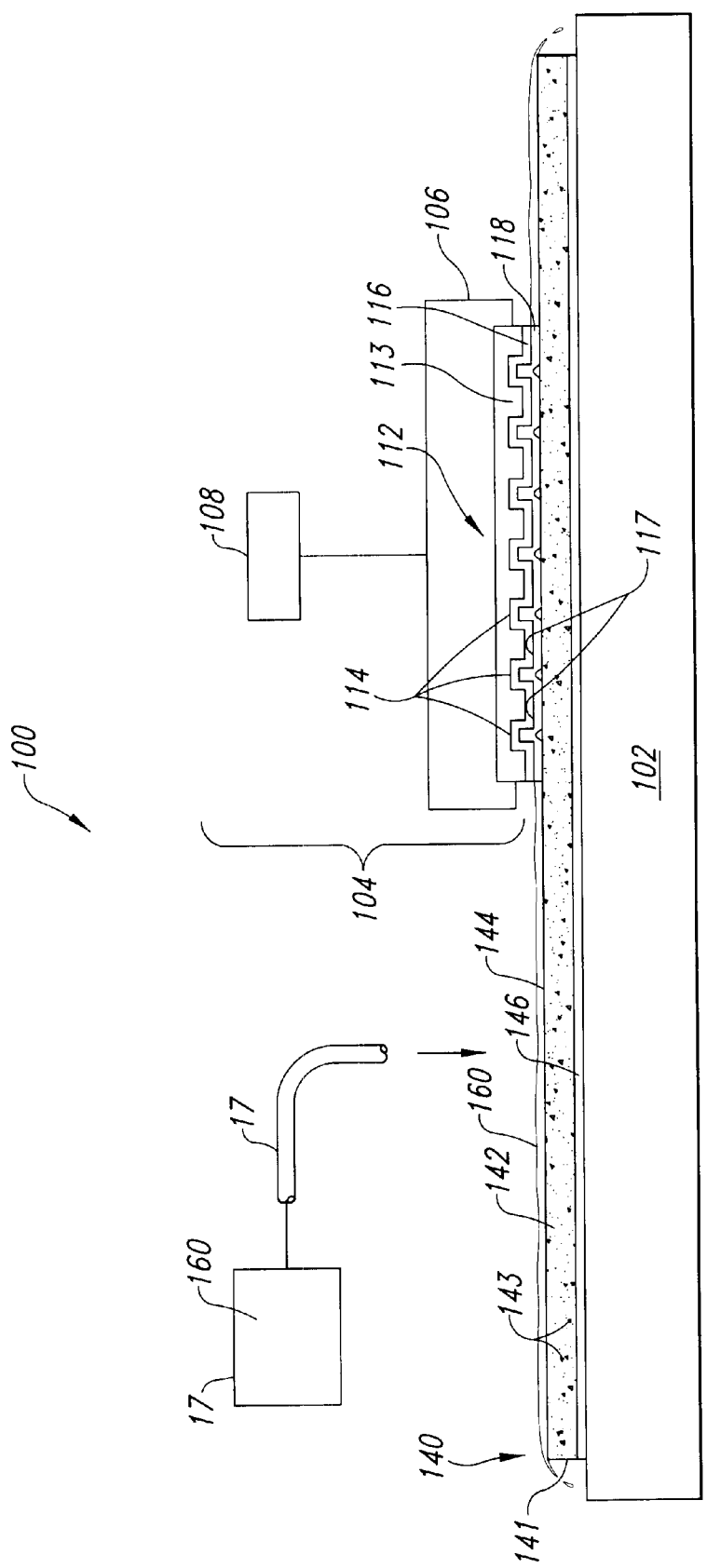
FIG. 2 is a schematic cross-sectional view of a planarizing machine with a planarizing solution for stop-on-feature planarization of a substrate assembly on a fixed-abrasive polishing pad in accordance with one embodiment of the invention.

FIG. 2 is a schematic cross-sectional view of a planarizing machine 100 for planarizing an SOF substrate assembly 112 on a fixed-abrasive polishing pad 140 using a non-abrasive planarizing solution 160 in accordance with an embodiment of the invention. The planarizing machine 100 includes a table 102 and a wafer carrier assembly 104. The table 102 can be a fixed support surface of a web-format planarizing machine, or the table 102 can be a rotary platen of a rotary planarizing machine. The wafer carrier 104 includes a carrier head 106 to hold the substrate assembly 112 and a drive system 108 to move the head 106 with respect to the table 102. Suitable web-format planarizing machines having a table and wafer carrier assembly are manufactured by Obsidian, Incorporated of Fremont, California, and suitable rotary planarizing machines are manufactured by Westech Systems, Inc. and Strasbaugh Corporation. Additionally, web-format and rotary planarizing machines are disclosed in U.S. Pat. Nos. 5,456,627; 5,486,131; 5,421,769; 5,234,867; 5,232,875; 5,069,002; 5,036,015, all of which are herein incorporated by reference.

The fixed-abrasive polishing pad 140 is placed on the surface of the support table 102. The fixed-abrasive pad 140 is typically adhered to a rotary platen in rotary applications, but slidably attached to a stationary table in web-format applications. The fixed-abrasive polishing pad 140 can include a body 141 having a suspension medium 142 and a plurality of abrasive particles 143 fixedly attached to the suspension medium 142 at a planarizing surface 144. The suspension medium 142 is typically a resin, and the abrasive particles 143 can be alumina, titania, silica, ceria, tantalum oxide or other abrasive particles. The polishing pad 140 can also include a backing film 146 attached to the back side of the body 141. The planarizing surface 144 can have a texture, such as truncated pyramids or mounds. Suitable fixed-abrasive pads are manufactured by 3M Corporation of St. Paul, Minn. Additionally, fixed-abrasive pads are disclosed in U.S. Pat. No. 5,645,471, and patent application Nos. 09/201,576 and 09/164,916, all of which are also herein incorporated by reference.

The stop-on-feature wafer 112 has a substrate 113 with a plurality of trenches 114 or holes, a conformal polish-stop layer 116 having lands 117 over portions of the substrate 113 outside of the trenches 114, and a cover layer 118 formed on the polish-stop layer 116. The polish-stop layer 116 has lower polishing rate than the cover layer 118. The polish-stop layer 116 accordingly inhibits further planarization as the lands 117 are exposed during planarization. In applications for forming shallow trench isolation structures in the trenches 114, the polish-stop layer 116 can be composed of silicon nitride and the cover layer can be composed of silicon dioxide, borophosphate silicon glass, or tetraethylorthosilicate glass. In other applications for forming damascene lines in the trenches 114, the polish-stop layer 116 can be composed of silicon nitride, silicon dioxide, a low K material, or other hard materials, and the cover layer 118 can be composed of polysilicon, aluminum, tungsten, copper, gold or other metals. For the purposes of this invention, a low K material is a material having a low dielectric constant, such as bisbenzocyclobutene (BCB), alkyl-silsesquioxanes, parylene N, fluorinated parylene or fluorinated silicon dioxide.

Although the polish-stop layer 116 alone inhibits planarization as the lands 117 are exposed, the fixed-abrasive polishing pad 140 may not selectively remove the cover layer 118 before removing too much of the exposed portions of the polish-stop layer 116. More particularly, the difference in hardness between the polish-stop layer 116 and the cover layer 118 alone may not produce a sufficiently high polishing rate ratio between the cover layer 118 and the polish-stop layer 116. It may also be detrimental to use a planarizing solution that chemically etches the cover layer at a faster rate than the polish-stop layer 116 with a selective etchant because such etching will produce depressions in the portions of the cover layer 118 remaining in the trenches 114. Accordingly, to increase the polishing rate ratio between the cover layer 118 and the polish-stop layer 116, several embodiments of this invention use a non-abrasive planarizing solution 160 that increases the mechanical removal rate of the cover layer 118 and/or reduces the mechanical removal rate of the polish-stop layer 116.

The non-abrasive planarizing solution 160 includes a mechanical selectivity agent that chemically interacts with the materials at the substrate surface to increase the polishing rate ratio between the cover layer 118 and the polish-stop layer 116. The planarizing solution 160 does not contain abrasive particles. The selectivity agent can chemically interact with the cover layer 118 to enhance the mechanical removal of the cover layer 118 and/or the selectivity agent can chemically interact with the cover layer 106 to impede the mechanical removal of the cover layer 106. The selectivity agent, for example, can be a chemical that adsorbs more to the cover layer 118 than to the polish-stop layer 116 so that the abrasive particles 143 in the polishing pad 140 can more readily remove material from the cover layer 118 than the polish-stop layer 116. Adsorption of the selectivity agent to the surface of the cover layer 118, for example, can increase the hydrolysis rate of the cover layer 118 or reduce the hydrolysis rate of the polish-stop layer 116 so that the cover layer 118 is much easier to mechanically remove than the polish-stop layer 116. Additionally, because mechanical removal dominates chemical removal in fixed-abrasive CMP, the increase in the difference of the mechanical removal rate between the cover layer 118 and the polish-stop layer 116 can significantly increase the mechanical selectivity of removing the cover layer 118 without removing significant portions of the polish-stop layer 116.

In one specific application for forming shallow-trench-isolation structures on the substrate assembly 112, the polish-stop layer 116 is a thin, conformal silicon nitride layer and the cover layer 118 is a silicon dioxide layer. The planarizing solution 160 for this embodiment can include water and ammonia or potassium hydroxide, and the selectivity agent in the planarizing solution 160 can be a non-ionic surfactant. One suitable non-ionic surfactant is polyoxyethylene (20) cetyl ether, such as Brij 58 available from Aldrich Chemical Co. of Milwaukee, Wis. The planarizing solution 160, for example, can include 50–1000 ppm Brij 58 in a water/ammonia solution containing 85%–99.5% water and 0.5%–15% ammonia. This particular application is expected to produce a 10:1 polishing rate ratio between the silicon dioxide cover layer and the silicon nitride polish-stop layer using the fixed-abrasive polishing pad 140. The addition of Brij 58 to the planarizing solution produces the significant increase in the polishing rate ratio by decreasing the hydrolysis of the silicon nitride polish-stop layer 116 relative to the silicon dioxide layer to make the silicon nitride polish-stop layer 116 even more resistant to mechanical removal. Other suitable non-ionic surfactants include polyoxyethylene ethers and polyoxyethylene alcohols, such as (a) polyoxyethylene (4) lauryl ether (Brij 30) and (b) polyoxyethylene (10) isooctyl phenol ether (Triton X-100).

In another application of the present invention for forming conductive damascene lines in the trenches 114 or contacts in holes through a dielectric layer, the polish-stop layer 116 is a thin layer of silicon dioxide or silicon nitride, and the cover layer 118 is a layer of a conductive metal, such as aluminum, tungsten, copper or gold. The planarizing solution for forming W conductive damascene lines or contacts can include water, hydrogen peroxide and/or ammonium persulfate, and the selectivity agent in the planarizing solution can be a polyoxyethylene non-ionic surfactant.

The methods and planarizing solutions described above with reference to FIG. 2 are expected to increase the difference in the polishing ratio between the cover layer 118 and the polish-stop layer 116. In the particular example of using a non-abrasive planarizing solution 160 with Brij 58 to planarize a silicon nitride polish-stop layer 116 and a silicon dioxide cover layer 118, the polishing rate ratio is increased to 10:1 from 4:1 without the Brij 58. The planarizing solution 160 with the mechanical selectivity agent is thus expected to reduce tie removal of material from the substrate assembly 112 beyond the lands 117 of the polish-stop layer 116.

Figure 3:
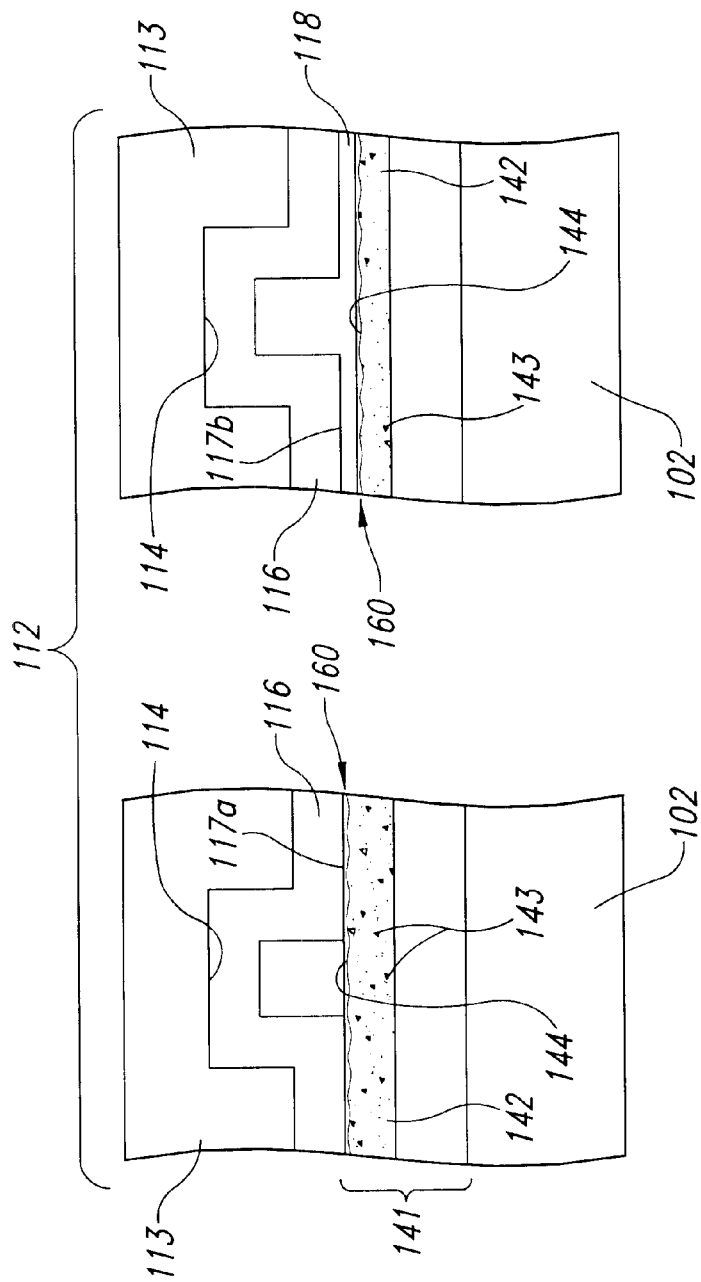
FIG. 3 is a partial cross-sectional view of a substrate assembly being planarized by a method in accordance with an embodiment of the invention.

FIG. 3 is a schematic cross-sectional view illustrating the advantages of planarizing the substrate assembly 112 with the planarizing solution 160 at a relatively late stage of a method in accordance with an embodiment of the invention. In this embodiment, the substrate assembly 112 has been planarized so that a first land 117a is exposed and a second land 117b is still covered by the cover layer 118. Because the mechanical selectivity agent in the planarizing solution 160 produces a 10:1 polishing rate ratio between a silicon nitride polish-stop layer 116 and a silicon dioxide cover layer 118, even the first land 117a of the polish-stop layer 116 is not likely to be completely removed before enough material is removed from the cover layer 118 to expose the second land 117b and isolate the portions of the cover layer 118 in the trenches 114. Therefore, planarizing solutions 160 with mechanical selectivity agents and the methods for planarizing semiconductor wafers using such planarizing solutions are expected to produce more accurate endpointing in CMP processing.

The non-abrasive planarizing solution 160 with the selectivity agent is also expected to produce highly planar surfaces without significant dishing in the trenches 114. The global planarity of the substrate assembly 112 is expected to be highly planar because the mechanical selectivity agent in the planarizing solution 160 effectively inhibits further planarization beyond the polish-stop layer 116. Thus, by accurately forming the lands 117 of the polish-stop layer 116 at a desired endpoint elevation, the substrate assembly 112 should be globally planar. Additionally, because the mechanical selectivity agent does not etch the cover layer 118 and instead changes the ability of the abrasive particles 143 in the polishing pad 140 to remove the cover layer 118 with respect to the polish-stop layer 116, the dominant mechanical removal characteristics of the fixed-abrasive pad 140 continue to control the removal of material from the substrate assembly 112. Consequently, the mechanically selective planarizing solution 160 does not produce dishing in the remaining portions of the cover layer 118 in the trenches 114. Therefore, the planarizing solution 160 with the mechanical selectivity agent is expected to provide a highly planar surface on the substrate assembly 112.

The non-abrasive solution 160 with the selectivity agent is also not readily apparent to a person of ordinary skill in the art. Although slurries with abrasive particles often include surfactants, such as Brij 58, the purpose of adding surfactants to abrasive slurries is to maintain the suspension of the abrasive particles in the slurry. It follows, therefore, that because the non-abrasive solution 160 does not have abrasive particles, there is no immediate reason to add surfactants to non-abrasive solutions for the same reason that surfactants are added to abrasive solutions. Thus, adding the selectivity agent to the non-abrasive solution 160 is not readily apparent to a person skilled in the art based upon abrasive solutions with surfactants.

From the foregoing it will be appreciated that, although specific embodiments of the invention have been described herein for purposes of illustration, various modifications may be made without deviating from the spirit and scope of the invention. For example, the mechanical selectivity agent can be materials other than surfactants that enhance the mechanical removal of the cover layer relative to the polish-stop layer without dissolving or otherwise etching material from the cover layer. Accordingly, the invention is not limited except as by the appended claims.

What is claimed is:

1. A method of planarizing a microlectronic substrate assembly, comprising:

pressing a substrate assembly at a planarizing surface of a fixed-abrasive polishing pad, the substrate assembly including a substrate, a polish-stop layer comprised of silicon nitride formed over the substrate to conform to a topography of features on the substrate, and a cover layer comprised of silicon dioxide formed over the polish-stop layer, and the fixed-abrasive pad including a body having a suspension medium and abrasive particles fixedly attached to the suspension medium at the planarizing surface;

covering operative portion of the planarizing surface with a non-abrasive planarizing solution without abrasive particles while the substrate assembly presses against the planarizing surface, the planarizing solution comprising 85–99.50% water, 0.5 to 15% ammonia, and 50–1000 ppm of a non-ionic surfactant that increases removal of the silicon dioxide cover layer and/or reduces removal of the silicon nitride polish-stop layer; and moving tile substrate assembly and/or the polishing pad with respect to the other while the substrate assembly presses against the planarizing surface covered with tile planarizing solution.

2. The method of claim 1 wherein:

the non-ionic surface is present at 50–500 ppm; and pressing the substrate assembly against the planarizing surface comprises contacting exposed areas of the silicon nitride polish-stop layer and the silicon dioxide cover layer against the planarizing solution and the abrasive particles at the planarizing surface.

3. The method of claim 1 wherein:

the non-ionic surface is polyoxyethylene (20) cetyl ether; and pressing the substrate assembly against the planarizing surface comprises contacting exposed areas of the silicon nitride polish-stop layer and the silicon dioxide cover layer against the non-ionic surfactant the abrasive particles at the planarizing surface.

4. The method of claim 1 wherein:

the non-ionic surfactant is polyoxyethylene (20) cetyl ether present at 50–500 ppm; and pressing the substrate assembly against the planarizing surface comprises contacting exposed areas of the silicon nitride polish-stop layer and the silicon dioxide cover layer against the planarizing solution and the abrasive particles at the planarizing surface.

5. The method of claim 1 wherein:

the planarizing solution further comprises potassium hydroxide and the surfactant is polyoxyethylene (20) cetyl ether; and pressing the substrate assembly against the planarizing surface comprises contacting exposed areas of the silicon nitride polish-stop layer and the silicon dioxide cover layer against the polyoxyethylene (20) cetyl ether and the abrasive particles at the planarizing surface.

6. A method of planarizing a microelectronic substrate assembly, comprising:

pressing a substrate assembly against a planarizing surface of a fixed-abrasive polishing pad, the substrate assembly including a substrate, a polish-stop layer comprised of silicon nitride formed over the substrate to conform to a topography of features on the substrate, and a cover layer comprised of silicon dioxide formed over the polish-stop layer, and the fixed-abrasive pad including a body having a suspension medium and abrasive particles fixedly attached to the suspension medium at the planarizing surface;

covering an operative portion of the planarizing surface with a non-abrasive planarizing solution without abrasive particles while the substrate assembly presses against the planarizing surface, the planarizing solution comprising 85–99.5% water, 0.5 to 15% ammonia, and 50–1000 ppm of a non-ionic surfactant that adsorbs with exposed surfaces of the cover layer; and moving the substrate assembly amd/or the polishing pad with respect to the other while the substrate assembly presses against the planarizing surface covered with the planarizing solution.

7. The method of claim 6 wherein:

the non-ionic surfactant is present at 50–500 ppm; and pressing the substrate assembly against the planarizing surface comprises contacting exposed areas of the silicon nitride polish-stop layer and the silicon dioxide cover layer against the planarizing solution and the abrasive particles at the planarizing surface.

8. The method of claim 6 wherein:

the non-ionic surfactant is polyoxyethylene (20) cetyl ether present at 50–500 ppm; and pressing The substrate assembly against the planarizing surface comprises contacting exposed areas of the silicon nitride polish-stop layer and the silicon dioxide cover layer against the polyoxyethylene (20) cetyl ether and the abrasive particles at the planarizing, surface.

9. A method of planarizing a semiconductor substrate assembly, comprising:

pressing a substrate assembly a planarizing surface of a fixed-abrasive polishing pad, the substrate assembly including a semiconductor substrate having a plurality of electrical components, a silicon nitride polish-stop layer formed over the substrate to conform to a topography of the components, and a silicon dioxide cover layer formed over the polish-stop layer, and the fixed-abrasive pad including a body having a suspension medium and abrasive particles fixedly attached to the suspension medium at the planaizing surface;

covering an operative portion of the planarizing surface with a non-abrasive planarizing solution without abrasive particles while the substrate assembly presses against the planarizing surface, the planarizing solution comprising 85–99.5% water, 0.5 to 15% ammonia, and 50–1000 ppm polyoxyethylene (20) cetyl ether, and moving the substrate assembly and/or the polishing pad with respect to the other while the substrate assembly presses against the planarizing surface covered with the planarizing solution.

10. The method of claim 9 wherein pressing the substrate assembly against the planarizing surface comprises contacting exposed areas of the silicon nitride polish-stop layer and the silicon dioxde cover layer against the planarizing solution and the abrasive particles at the planarizing race.

11. The method of claim 9 wherein:

the planarizing solution comprises 60–500 ppm polyoxyethylene (20) cetyl ether; and pressing the substrate assembly against the planarizing surface comprises contacting exposed areas of the silicon nitride polish-stop layer and the silicon dioxide cover layer against the polyoxyethylene (20) cetyl ether and the abrasive particles at the planarizing surface.

12. A planarizing apparatus, comprising:

a table;

a polishing pad on the table, the polishing pad being a fixed-abrasive pad having a body including a suspension medium and a plurality of abrasive particles fixedly attached to the suspension medium at a planarizing surface;

a planarizing solution coating at least an operative area of the planarizing surface, the planarizing solution including a non-abrasive aqueous solution without abrasive particle and comprising 85–99.5% water, 0.5 to 15% ammonia, and 50–1000 ppm of a non-ionic surfactant;

a microelectronic substrate assembly having a substrate, features formed on the substrate, a polish-stop layer comprised of silicon nitride formed over the substrate to conform to a topography of the features, and a cover layer comprised of silicon dioxide formed over the polish-stop layer; and a substrate carrier assembly having a head to hold and move the substrate assembly, the head and/or the polishing pad being moved with respect to one another to rub the substrate assembly against the abrasive particles and the planarizing solution at the planarizing surface.

13. The apparatus of claim 12 wherein:

the planarizing solution comprises 50–500 ppm polyoxyethylene (20) cetyl ether.

\* \* \* \* \*

UNITED STATES PATENT AND TRADEMARK OFFICE
CERTIFICATE OF CORRECTION

PATENT NO.   : 6,376,381 B1  
DATED        : April 23, 2002  
INVENTOR(S)  : Gundu M. Sabde It is certified that error appears in the above-identified patent and that said Letters Patent is hereby corrected as shown below:

Column 7,
Line 20, reads "at" should read -- against --
Line 30, reads "covering operative" should read -- covering an operative --
Lines 39 and 41, reads "tile" should read -- the --
Lines 44 and 51, reads "surface" should read -- surfactant --
Line 61, reads "plamarizing" should read -- planarizing --

Column 8,
Line 27, reads "adsorbs" should read -- absorbs --
Line 29, reads "amd/or" should read -- and/or --
Line 43, reads "pressing The" should read -- pressing the --
Line 47, reads "planarizing, surface." should read -- planarizing surface. --
Line 59, reads "planaizing" should read -- planarizing --

Column 9,
Line 9, reads "race" should read -- surface --

Column 10,
Line 14, reads "moved" should read -- moveable --

Signed and Sealed this

Fifteenth Day of October, 2002

*Attest:*

JAMES E. ROGAN  
*Attesting Officer*   *Director of the United States Patent and Trademark Office*